United States Patent [19]
Hedberg

[11] Patent Number: 6,081,133
[45] Date of Patent: Jun. 27, 2000

[54] UNIVERSAL RECEIVER DEVICE

[75] Inventor: Mats Hedberg, Haninge, Sweden

[73] Assignee: Telefonaktiebolaget LM Ericsson, Stockholm, Sweden

[21] Appl. No.: 09/073,958

[22] Filed: May 7, 1998

Related U.S. Application Data

[63] Continuation of application No. PCT/SE96/01395, Nov. 6, 1996.

[30] Foreign Application Priority Data

Nov. 10, 1995 [SE] Sweden ................................ 9503996

[51] Int. Cl.$^7$ .............................................. H03K 19/0175
[52] U.S. Cl. ................................................. 326/83; 326/68
[58] Field of Search ................................. 326/68, 83, 73, 326/115

[56] References Cited

U.S. PATENT DOCUMENTS

| | | |
|---|---|---|
| 4,767,979 | 8/1988 | Tanigawa . |
| 5,111,080 | 5/1992 | Mizukami et al. . |
| 5,568,082 | 10/1996 | Hedberg . |
| 5,625,648 | 4/1997 | Hedberg . |
| 5,710,516 | 1/1998 | Kim ......................................... 326/115 |
| 5,736,871 | 4/1998 | Goto ........................................ 326/115 |
| 5,754,060 | 5/1998 | Nguyen et al. ............................ 326/86 |
| 5,761,244 | 6/1998 | Hedberg . |

FOREIGN PATENT DOCUMENTS

| | | |
|---|---|---|
| 0 380 152 | 8/1990 | European Pat. Off. . |
| 0 579 314 | 5/1995 | European Pat. Off. . |
| 0 651 511 | 5/1995 | European Pat. Off. . |
| 94/24797 | 10/1994 | WIPO . |

*Primary Examiner*—Michael Tokar
*Assistant Examiner*—Richard Roseen
*Attorney, Agent, or Firm*—Burns, Doane, Swecker & Mathis, L.L.P.

[57] ABSTRACT

A receiver device includes two input circuits, connected in parallel, for receiving digital information in the form of electrical differential binary signals within a broad range of common-mode voltages. The input circuits in turn include transistors in differential input arrangements for receiving the signals. The transistors of input circuits are of one and the same type, so that the receiver device is capable of handling higher speeds. Controlled activation and deactivation of a first one of the input circuits further enhances the speed capabilities of the receiver device.

3 Claims, 8 Drawing Sheets

UNIVERSAL RECEIVER DEVICE

This application is a continuation of International Application No. PCT/SE96/01395, which was filed on Nov. 6, 1996, which designated the United States, and which is expressly incorporated here by reference.

BACKGROUND

The invention relates to a receiver device for receiving digital information in the form of electrical differential binary signals sent from a sender device. The receiver device through differential amplifier circuitry provides the information in a form suitable to digital logic circuits.

Advances in electronic technology and design, and a strive towards boosted performance in terms of power consumption and speed, among many other things, has led to a variety of concepts for digital logic circuits and digital signalling between circuits and circuit boards. Early concepts are DTL (Diode-Transistor Logic), TTL (Transistor-Transistor Logic) and ECL (Emitter Coupled Logic), which concepts are used both within digital logic circuits and for digital signalling between circuits and circuit boards.

More recent concepts, mostly used between circuits and circuit boards, employ differential signalling, also known as balanced signalling, which uses two signalling wires. DPECL (Differential Pseudo Emitter Coupled Logic), LVDS (Low Voltage Differential Signalling) and GLVDS (Grounded Low Voltage Differential Signalling) are examples of signalling concepts which use differential signalling. GLVDS is disclosed in the Swedish patent applications number SE 9304025-1 and number SE 9400971-9.

Although the above mentioned differential signalling concepts are indeed differential, each of the two signalling wires operate at fixed nominal voltages that are related to ground. Each wire operates at two voltage levels, referred to as low voltage level and high voltage level, respectively.

DPECL typically has a signalling low voltage level of 3.3 V, and a high level of 4.1 V. LVDS on the other hand has a low level of 1.0 V, and a high level of 1.4 V, while GLVDS has a low level of 0.1 V and a high level of 0.4 V. The voltages are related to ground. Signalling voltages hence span from almost 0 V up to more than 4 V.

A receiver device for receiving differential signals from the above described types of signalling concepts is often contained together with digital logic circuits in one integrated circuit, in order to reduce packaging, to reduce the required size of circuit-boards and, ultimately, to reduce cost. Preferably, a single supply-voltage is used for the integrated circuit, which supply voltage is shared both by the receiver device and by the digital logic circuits, whereby costly circuit technologies capable of handling multiple voltages are avoided. New circuit technologies however operate at very low supply voltages of 3.3 V or less, which enforces operation of the receiver device at these very low supply voltages.

At low supply voltages, only a small margin, if any, is provided for circuitry of a receiver device compatible with DPECL, LVDS, GLVDS and other signalling concepts. At a low supply voltage, circuitry of such a receiver device must operate at common-mode voltages both close to the supply voltage, or even above the supply voltage, and close to ground, preferably even lower than ground. Common-mode voltage refers to the average voltage, related to ground, at the inputs of circuitry known as a differential amplifier. Said receiver device is a differential amplifier. Differential amplifiers exist, which are capable of handling common-mode voltages close to the supply voltage, and close to ground. These are known as rail-to-rail amplifiers.

Known rail-to-rail amplifiers however exhibit a bandwidth and a propagation delay which are dependent on the applied common-mode voltage. This reduces the usable bandwidth and the ability of the amplifier to reject common-mode noise at high speeds, and makes signal skew quite unmanageable at high speeds.

Furthermore, known rail-to-rail amplifiers do not handle common-mode voltages higher than the supply voltage, or lower than ground. At a supply voltage of less than approximately 4.5 V, known rail-to-rail amplifiers are therefore not compatible with e.g. DPECL.

It is known in the art that a voltage dividing network is arranged at the inputs of a differential amplifier, for increasing the common-mode range. A voltage dividing network however attenuates the received signal, which makes it a poor solution for signals having low amplitudes. Moreover, process variations increase asymmetry of the received signal.

In U.S. Pat. No. 5,111,080 is disclosed a signal transmission circuit in which a signal is converted into two complementary signals which are output from a signal transmission circuit via series resistors. The amplitude of each of the complementary signals is reduced by the series resistors and terminating resistors provided on a signal receiving side. The signal receiving side shifts the level of its received input signal. The levelshifted signals are amplified by a high-input impedance differential amplifying circuit.

EP patent number 0579314A1 discloses an input buffer circuit. The input circuit receives a low level signal and a voltage reference, which are largely free from disturbing signals. The input buffer circuit comprises reducing means for reducing an offset voltage.

The Japanese patent number 4,767,979 discloses a switching circuit device which uses current mirror circuits. A first group of current mirror circuits is provided wherein a plurality of signal currents supplied via input terminals are superimposed upon mirror currents and signal currents resulting from the superimposition are derived as new mirror currents. A second group of current mirrors is provided to which the new mirror currents are supplied. The output stages of the second group of current mirror circuits are connected to each other at a common point which in turn is tied to the output stage of a current mirror circuit for supplying a mirror current of a predetermined magnitude. An output terminal is led out of said common point. Bias voltage for said second group of current mirror circuits is controlled so that any desired signal current is selected from said plurality of signal currents.

The Swedish patent application number 9400593-1 discloses a receiver device in which current mirrors are used in the input stage.

SUMMARY

An object of the present invention is to provide electronic circuitry for a universal receiver device which operates at high speeds within a broad range or common-mode voltages, even slightly lower than ground and higher than the supply voltage.

This object is accomplished by electronic circuitry.

According to the invention, higher speeds can be handled by the receiver device, and the range of signalling voltages which are received and processed by the receiver device without corruption of information is extended as compared to prior art, for a given supply voltage. Common-mode-rejection is improved.

BRIEF DESCRIPTION OF DRAWINGS

The invention, together with further objects and advantages thereof, will become clear from the following description by making reference to the accompanying drawings, in which.

DETAILED DESCRIPTION

Figure 1:
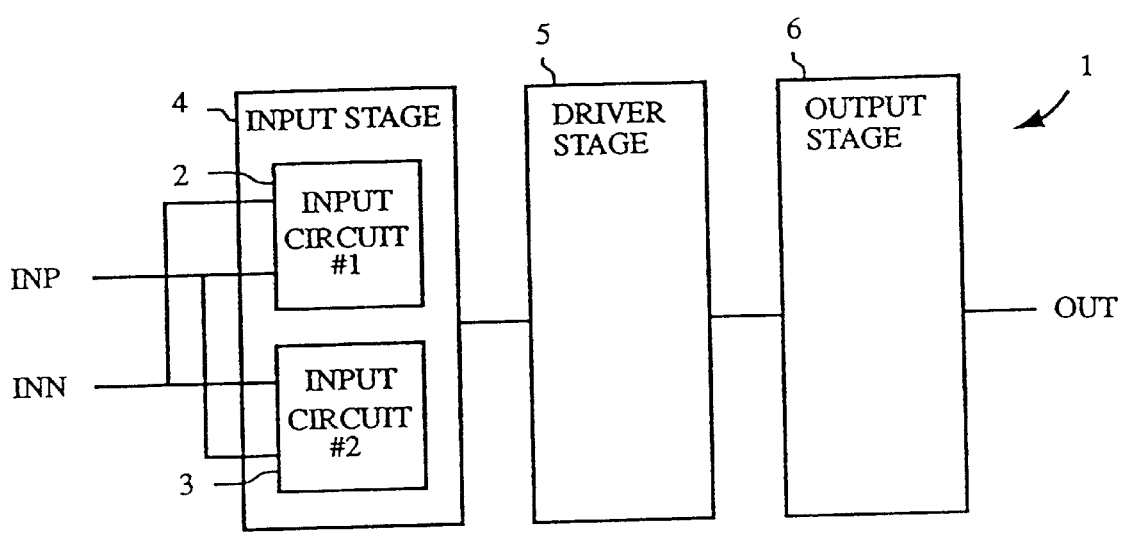
FIG. 1 is a block diagram of a rail-to-rail amplifier which constitutes a receiver device on which the invention is based.

In FIG. 1, a receiver device 1 is shown in the form of a block diagram. The receiver device 1 has a first input circuit 2, and a second input circuit 3, which input circuits 2, 3 are connected in parallel. The input circuits 2, 3 are included in an input stage 4. Two signal inputs INP, INN are each connected to the two input circuits 2, 3. The input stage 4 is connected to a driver stage 5. The driver stage 5 is in turn connected to an output stage 6. The receiver device 1 receives at its inputs INP, INN a differential signal, and produces at its output OUT a corresponding signal suitable for digital logic circuits. The receiver device 1 has a certain common-mode range. The common-mode range refers to the voltage range of the received signal, related to a fix reference, e.g. ground, within which the receiver device 1 processes said signal without corrupting information being carried therein. The first input circuit 2 is active within one portion of said common-mode range, and the second input circuit 3 is active within another portion of said common-mode range. Said portions may overlap. A receiver device such as this has an extended common-mode range as compared to receiver devices having only one input circuit. Allowable common-mode voltages approach both ground and the supply voltage. Amplifiers possessing this property are known in the art as rail-to-rail amplifiers.

Figure 2:
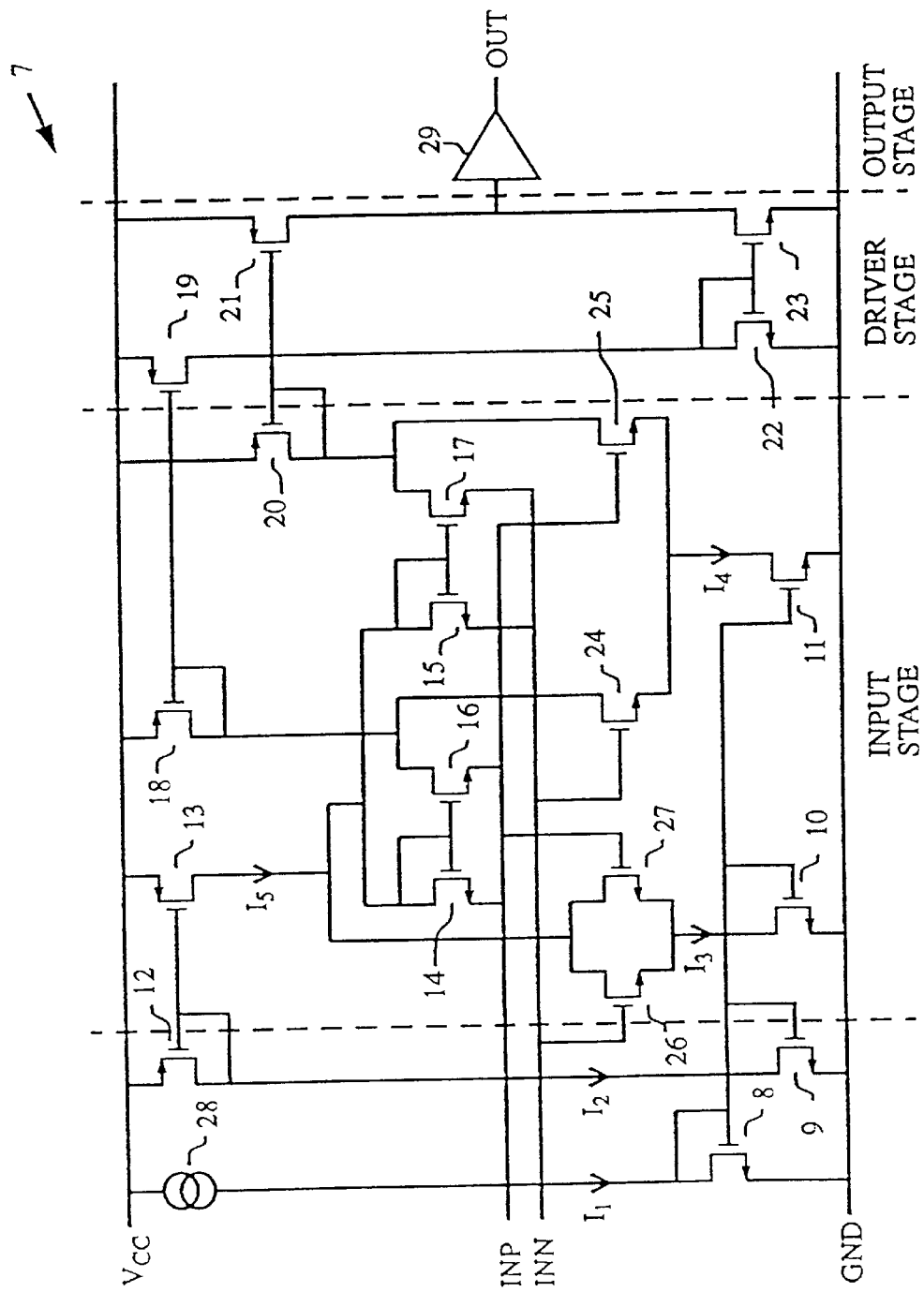
FIG. 2 is a circuit diagram showing a first embodiment of the receiver device according to FIG. 1.

FIG. 2 shows a receiver device 7, which is a first embodiment of the receiver device 1 according to FIG. 1. The receiver device 7 comprises N-MOS and P-MOS transistors 8–27, a current generator 28 and an output stage 29. The output stage is known per se, and is therefore not shown in detail. Said transistors 8–27, the current generator 28 and the output stage 29 are interconnected as indicated in the drawing.

The current generator 28 feeds a constant current $I_1$ through the channel of the N-MOS transistor 8. The N-MOS transistor 8 is a part of a circuit arrangement well known in the art as a current mirror. Said current mirror also comprises the transistors 9–11. The transistors 9–11 each sink a constant current $I_2$, $I_3$, $I_4$ which is equal to or proportional to the current $I_1$, provided the voltage across the channel of respective transistor 9, 10, 11 is sufficiently large, e.g. larger than 0.5 V. The transistors 12, 13 form another current mirror, in which a current $I_5$, sourced by the transistor 13, is constant and equal to or proportional to the current $I_2$, and therefore also to the current $I_1$, provided the voltage across the channel of the transistor 13 is sufficiently large. The receiver device 7 comprises further current mirrors, which will be explained in their respective contexts. For simplicity, all current mirrors are assumed herein, unless otherwise noted, to have a one-to-one current-relationship. It is appreciated by those skilled in the art however, that currents are scalable in the current mirrors of the receiver device 7. Actually, power dissipation is decreased in the receiver device 7 by proper scaling of currents. Scaling of currents is also done to compensate for mismatching propagation delays within the receiver device.

Two distinct modes of operation, and a combination of the two modes of operation of the receiver device 7 will be described. $V_{CC}$ is set to 3.3 V as an example. In a first distinct mode of operation, the common-mode voltage, i.e. the average signalling voltage at the inputs INP, INN is in the lower region of the common-mode range of the receiver device 7, e.g. around 0.5 V related to ground. In a second distinct mode of operation, the common-mode voltage is in the upper region of the common-mode range, e.g. around 2.5 V. In both modes, the voltage at the input INP minus the voltage at the input INN may be either positive, negative or zero, i.e. either the voltage at the input INP is higher than the voltage at the input INN, the voltage at the input INN is higher than the voltage at the input INP, or the voltages at the inputs INP, INN are equal.

Figure 3:
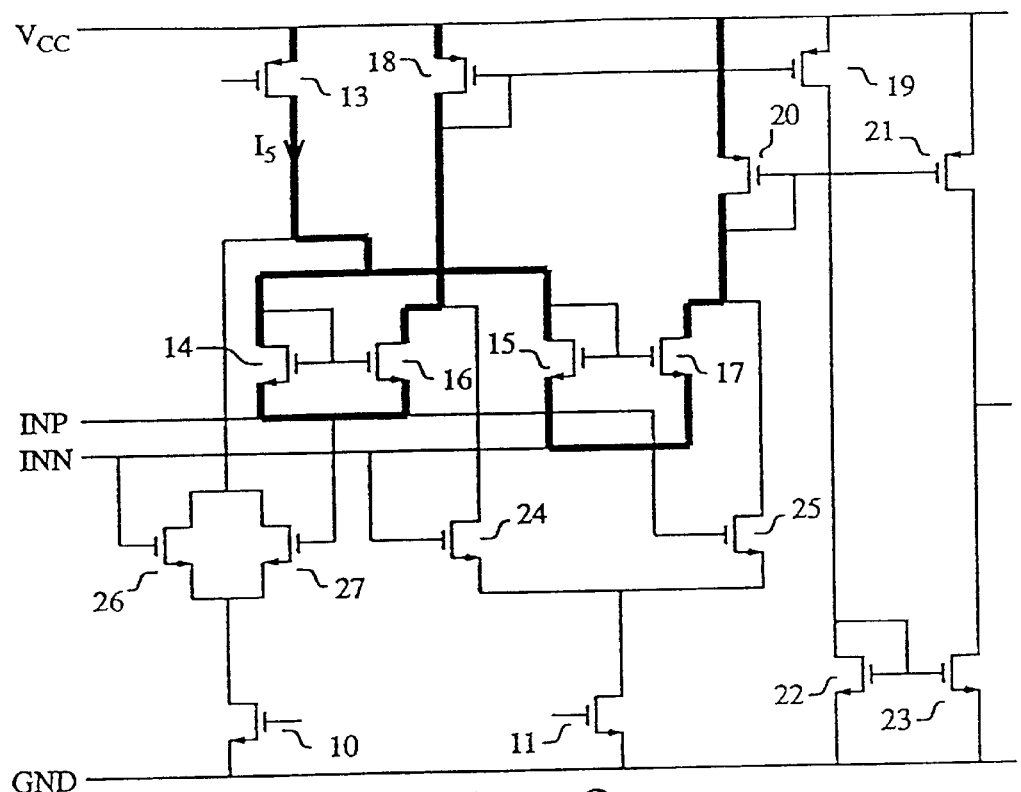
FIG. 3 is a circuit diagram showing a portion of the embodiment of FIG. 2, in which portion certain connections are highlighted for better illustrating a first input circuit.

FIG. 3 shows the receiver device 7 in part. Some connections are highlighted (drawn with thick lines) in order to better illustrate a first input circuit corresponding to the first input circuit 2 of the receiver device shown in FIG. 1. The first input circuit comprises the transistors 13, 14, 15, 16, 17, 18 and 20. The function in the first distinct mode of operation will now be described. The transistors 14 and 15 receive from outside the receiver device the differential signal present at the inputs INP, INN in the first distinct mode of operation. The differential signal is received directly at the source terminals of the transistors 14 and 15. The voltage drops $U_{GS}$ of the transistors 24, 25, 26, 27, are not sufficiently large to make said transistors 24, 25, 26, 27 conduct in the first distinct mode of operation.

The constant current $I_5$ is drawn through the transistor 15 alone, through the transistor 14 alone, or through both transistors 14, 15 at the same time, depending on the input signal applied at the inputs INP, INN. Due to a feedback from the drain terminals to the gate terminals of the transistors 14, 15, the voltage drops $U_{DS}$ across said transistors 14, 15 can become only slightly larger than the threshold voltages $U_{GSth}$ of said transistors 14, 15. In effect, if the voltage at the input INP is considerably higher than the voltage at the input INN, the voltage drop $U_{DS}$ across the transistor 15 limits the voltage $U_{GS}$ across the transistor 14 such that the threshold voltage $U_{GSth}$ of the transistor 14 is not reached, and hence the transistor 14 does not conduct current. The current $I_5$ is drawn solely through the transistor 15. If, on the other hand, the voltage at the input INN is considerably higher than the voltage at the input INP, the voltage drop $U_{DS}$ across the transistor 14 limits the voltage $U_{GS}$ across the transistor 15 such that the threshold voltage $U_{GSth}$ of the transistor 15 is not reached, and hence the transistor 15 does not conduct current. The current $I_5$ is drawn solely through the transistor 14. If the voltages at the inputs INP, INN are approximately equal, both transistors 14, 15 are conducting current, and each one of said transistors 14, 15 draw a respective portion of the current $I_5$.

The transistors 14, 16 are comprised in a current mirror, and the transistors 15, 17 are comprised in another current mirror. Furthermore, each one of the transistor pairs 18, 19; 20, 21 and 22, 23 is comprised in a respective current mirror. Currents through the transistors 14, 15 are reflected in respective currents through the transistors 16, 17. A current through the transistor 16, and hence also through the transistor 18, is reflected in a current through the transistors 19, 22. Consequently, the transistor 23 is capable of sinking a current determined by the current through the transistor 14. Similarly, a current that is drawn through the transistor 17 is also drawn through the transistor 20. Consequently, the transistor 21 is capable of sourcing a current determined by the current through the transistor 15.

Thus, provided the input voltages at the inputs INP, INN are not equal, either the transistor 21 sources current to the output stage, or the transistor 23 sinks current from the output stage. Accordingly, a resulting voltage at the output stage 29 is either high, i.e. close to $V_{CC}$, or low, i.e. close to GND, determined by the input signal at the inputs INP, INN. When the voltage at the input INP is higher than the voltage at the input INN, e.g. 0.25 V higher, the output OUT is high and vice versa. Equal voltages at the inputs INP, INN would cause the voltage being fed to the output stage 29, and hence being present at the output OUT, to be indeterminate.

Figure 4:
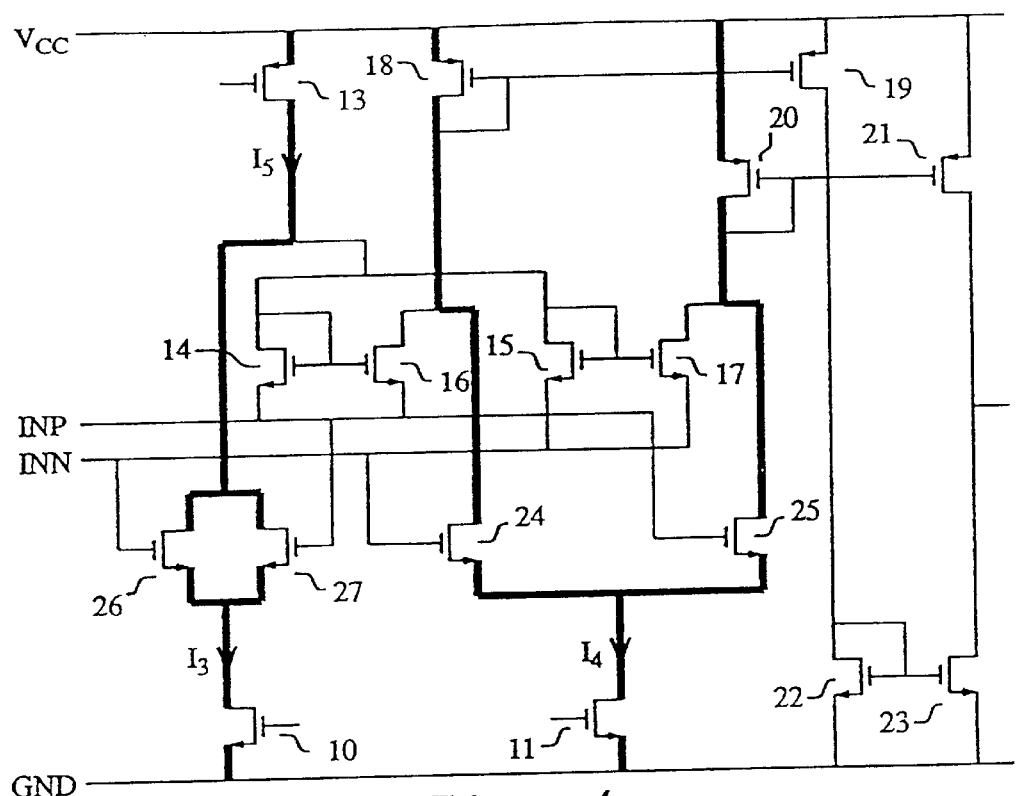
FIG. 4 is a circuit diagram showing a portion of the embodiment of FIG. 2, in which portion certain connections are highlighted for better illustrating a second input circuit.

FIG. 4 also shows the receiver device 7 in part. Some connections are highlighted (drawn with thick lines) in order to better illustrate a second input circuit corresponding to the second input circuit 3 of the receiver device shown in FIG. 1. The second input circuit comprises the transistors 10, 11, 13, 18, 20, 24, 25, 26 and 27. The function of the receiver device 7 in the second distinct mode of operation will now be described. The transistors 24, 25 receive from outside the receiver device the differential signal present at the inputs INP, INN in the second distinct mode of operation. The differential signal is received directly at the gate terminals of the transistors 24 and 25. Moreover, the transistors 26 and 27 receive from outside the receiver device the differential signal present at the inputs INP, INN in the second distinct mode of operation. The differential signal is received directly at the gate terminals of the transistors 26 and 27, for substantially disengaging the first input circuit in the second distinct mode of operation.

As previously mentioned, the common-mode voltage in the second distinct mode of operation is in the upper region of the common mode range, e.g. around 2.5 V. The transistors 26, 27, shunt the current $I_5$. No current is thus drawn through the transistors 14, 15, and consequently the transistors 16, 17 do not conduct current. Regardless of this, the voltage drop $V_{CC}$ minus INP or INN is not sufficiently large for the transistors 13–17 to conduct in the second distinct mode of operation.

If the voltage at the input INP is considerably higher than the voltage at the input INN, the voltage drop $U_{GS}$ across the transistor 25 is sufficiently large to make said transistor 25 conduct current, while the voltage drop $U_{GS}$ across the transistor 24 does not reach the threshold voltage $U_{GSth}$, and hence said transistor 24 does not conduct current. The current $I_4$ is drawn solely through the transistor 25 and through the transistor 20. Consequently, the transistor 21 is capable of sourcing a current determined by the current through the transistor 25. If, on the other hand, the voltage at the input INN is considerably higher than the voltage at the input INP, the current $I_4$ is drawn solely through the transistor 24 and through the transistor 18. The current through the transistor 18 is reflected in a current through the transistor 19 and further through the transistor 22. Consequently, the transistor 23 is capable of sinking a current determined by the current through the transistor 24. If the voltages at the inputs INP, INN are approximately equal, both transistors 24, 25 are conducting current, and each one of said transistors 24, 25 draws a respective portion of the current $I_4$. In the second mode of operation, the current $I_4$ is constant.

When the voltage at the input INP is higher than the voltage at the input INN, e.g. 0.25 V higher, the output OUT is hence high and vice versa. Equal voltages at the inputs INP, INN would cause the voltage being fed to the output stage 29, and hence being present at the output OUT, to be indeterminate.

Important aspects of the invention are to effect a high usable bandwidth and a low and essentially constant signal propagation delay of the receiver device 7 throughout the common-mode range. Therefore, said first input circuit, and said second input circuit are mutually matched, as regards bandwidth and propagation delay. Transistors 14, 15, 24, 25 are used, which are of one and the same type, for receiving signals applied at the inputs INP, INN. Furthermore, the transistors 26 and 27 are the same type as the transistors 24 and 25, and the transistors 16 and 17 are of the same type as the transistors 14 and 15. In this embodiment, the transistors 14, 15, 16, 17, 24, 25, 26 and 27 are of N-MOS type, because these have higher bandwidth and gain (transconductance), and a lower propagation delay than do their complementary P-MOS counterparts. Transistor gain is of particular importance for transistors in an input circuit of a receiver device, which transistors receive signals from outside said receiver device. Such signals often have a low differential signal amplitude, that renders compensation of low gain difficult. A differential signal amplitude is the voltage between the inputs of a differential amplifier, such as the inputs INP, INN of said receiver device 1.

A constant propagation delay is further accomplished by holding the sum of the current through the transistor 18 and the current through the transistor 20 constant across both modes of operation. If said currents were allowed to vary, the time it would take for particularly the transistors 21, 23 to respond to changes would vary, and thus result in a non-constant propagation delay. The transistors 26, 27 play a significant role in keeping said currents constant, by controlling activation and deactivation of the first input circuit. Operation between the two distinct modes of operation will now be described.

For a common-mode voltage around 1.0 V, said first input circuit is active, and said second input circuit is at the verge of being active. The current $I_4$ is small. The currents through the transistors 18, 20 are the aggregate of currents through the transistors 16, 24 and through the transistors 17, 25. Said currents equal the sum of the current $I_4$ and the current fed through the transistors 14, 15. A slight increase in the common-mode voltage results in a current $I_4$ drawn through the transistors 18, 20. Due to a similar interconnection of the transistors 10, 26, 27 and the transistors 11, 24, 25, and good matching of said transistors 10, 11, 24, 25, 26, 27, the current $I_3$ drawn through the transistors 26, 27 is equal to the current $I_4$. The current $I_3$ is drawn from the current $I_5$, whereby the currents through the transistors 14, 15, and hence the currents through the transistors 16, 17, decrease. The sum of currents being drawn through the transistors 18, 20 is maintained constant. At further increases of the common-mode voltage, the current $I_4$, and consequently the current $I_3$, are successively increasing until the current-mode is approached, at which point said first input circuit is completely deactivated. When the common-mode voltage is being increased, said second input circuit is hence gradually becoming more active, while said first input circuit is gradually becoming more non-active and vice versa. Thus, the modes of operation are partially overlapping.

Figure 5:
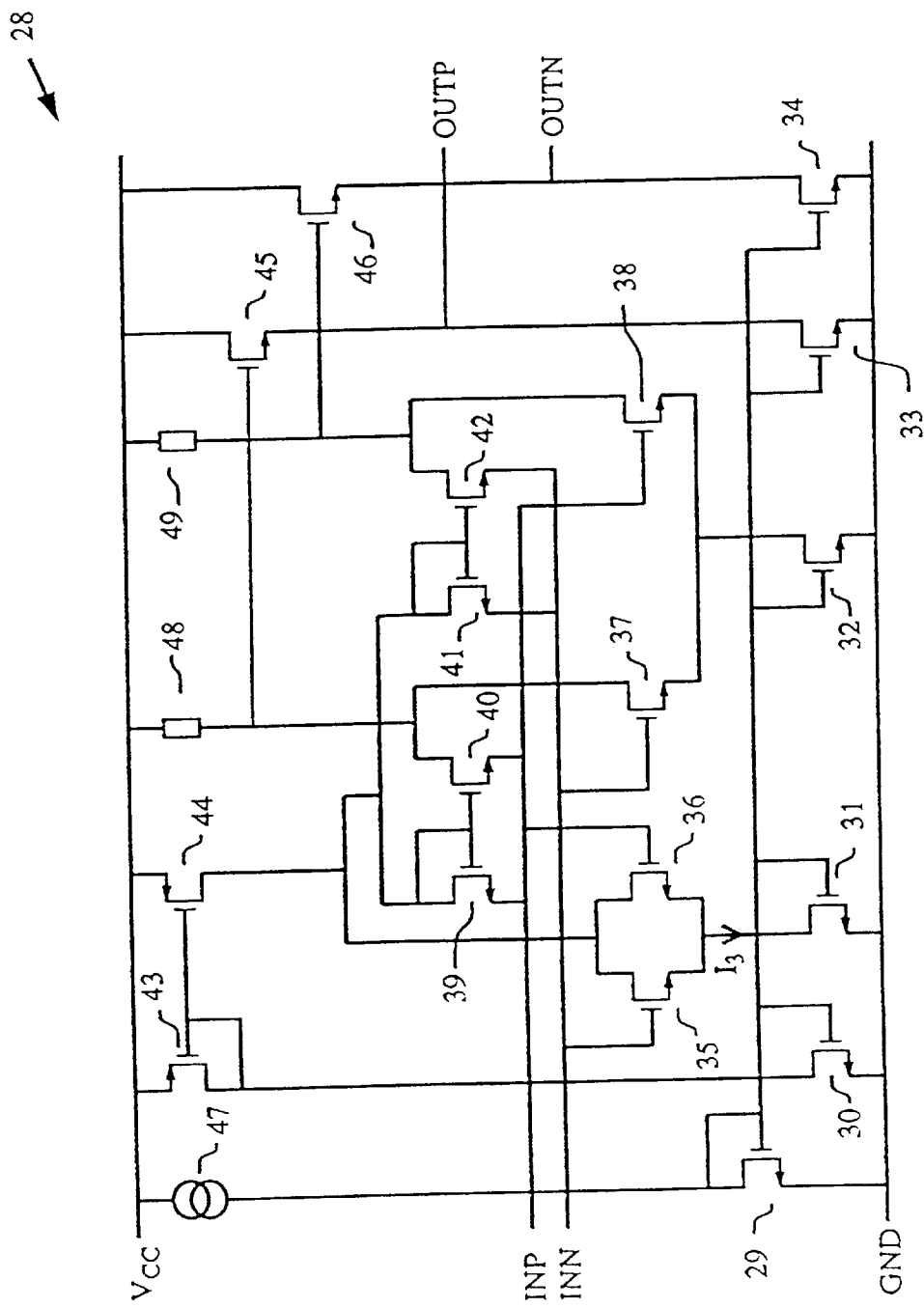
FIG. 5 is a circuit diagram showing a second embodiment of the receiver device according to FIG. 1.

FIG. 5 shows a receiver device 28, which is a second embodiment of the receiver device 1 according to FIG. 1. The receiver device 28 has a common-mode voltage range beyond that of the receiver device 7, shown in FIG. 2, at equal supply voltages. The allowable common-mode voltages exceed the supply voltage. The receiver device 28 has differential outputs. The receiver device 28 comprises N-MOS and P-MOS transistors 29–46, a current generator 47 and resistive elements 48, 49. Said transistors 29–46, the current generator 47 and the resistive elements are interconnected as indicated in the drawing.

In the receiver device 28, the resistive elements 48, 49 replace the transistors 18, 20 of the receiver device 7. If the voltage at the input INP is higher than the voltage at the input INN, e.g. 0.25 V higher, a current is drawn through the resistive element 49, but not through the resistive element 48. The current through the resistive element 49 results in a voltage drop across said resistive element 49, which voltage drop lowers the voltage across the transistor 46, connected as a source follower, such that the output OUTP is more positive than the output OUTN. If, on the other hand, the voltage at the input INN is larger than the voltage at the input INP, the voltage at the output OUTN is more positive than the output OUTP, which is evident from the symmetry of the circuit.

The receiver device is typically implemented in an integrated circuit. In a circuit technology that does not provide resistors, the resistive elements 48, 49 typically consist of transistor which emulate resistors, in a manner known per se.

Figure 6:
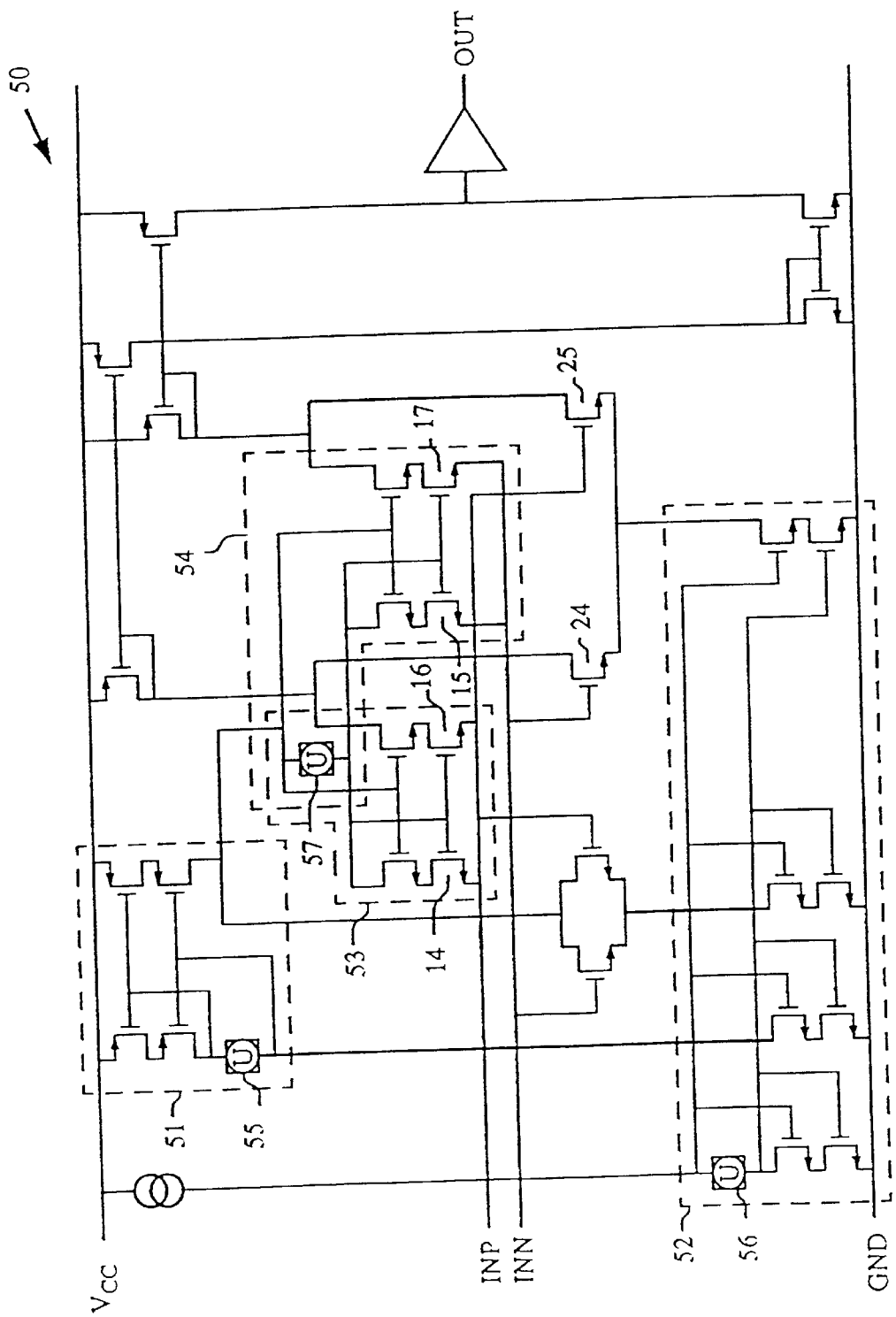
FIG. 6 is a circuit diagram showing a third embodiment of the receiver device according to FIG. 1.

FIG. 6 shows a receiver device 50, which is a third embodiment of the receiver device 1 according to FIG. 1. The receiver device 50 comprises N-MOS and P-MOS transistors, a current generator and voltage generators 55, 56, 57. Said transistors, the current generator and the voltage generators are interconnected as indicated in the drawing. Several of the current mirrors of the receiver device 7 are replaced by current mirrors 51, 52, 53, 54 comprising transistors in cascode arrangements. These cascode arrangements are essentially known from e.g. the swedish patent application number SE 9400593-1. A reference voltage is however provided by a voltage generator, e.g. a transistor, not shown, in the path of the reference current of the current mirror rather than by a separate circuit arrangement. Current mirrors comprising cascode arrangements are less voltage dependent than the simple common types. Voltage dependence introduces an error in the reflected current of a current mirror. A low error is particularly desirable in circuitry comprising several current mirrors which are chained together, such as in the embodiments shown herein. An error in the reflected currents multiplies through the chain of current mirrors, which affects the working point of a receiver device at variations in the common-mode voltage and variations in the supply voltage. In a receiver device implemented in certain circuit technologies, the error would be quite large if using said simple common types of current mirrors. This would cause poor operation.

Figure 7:
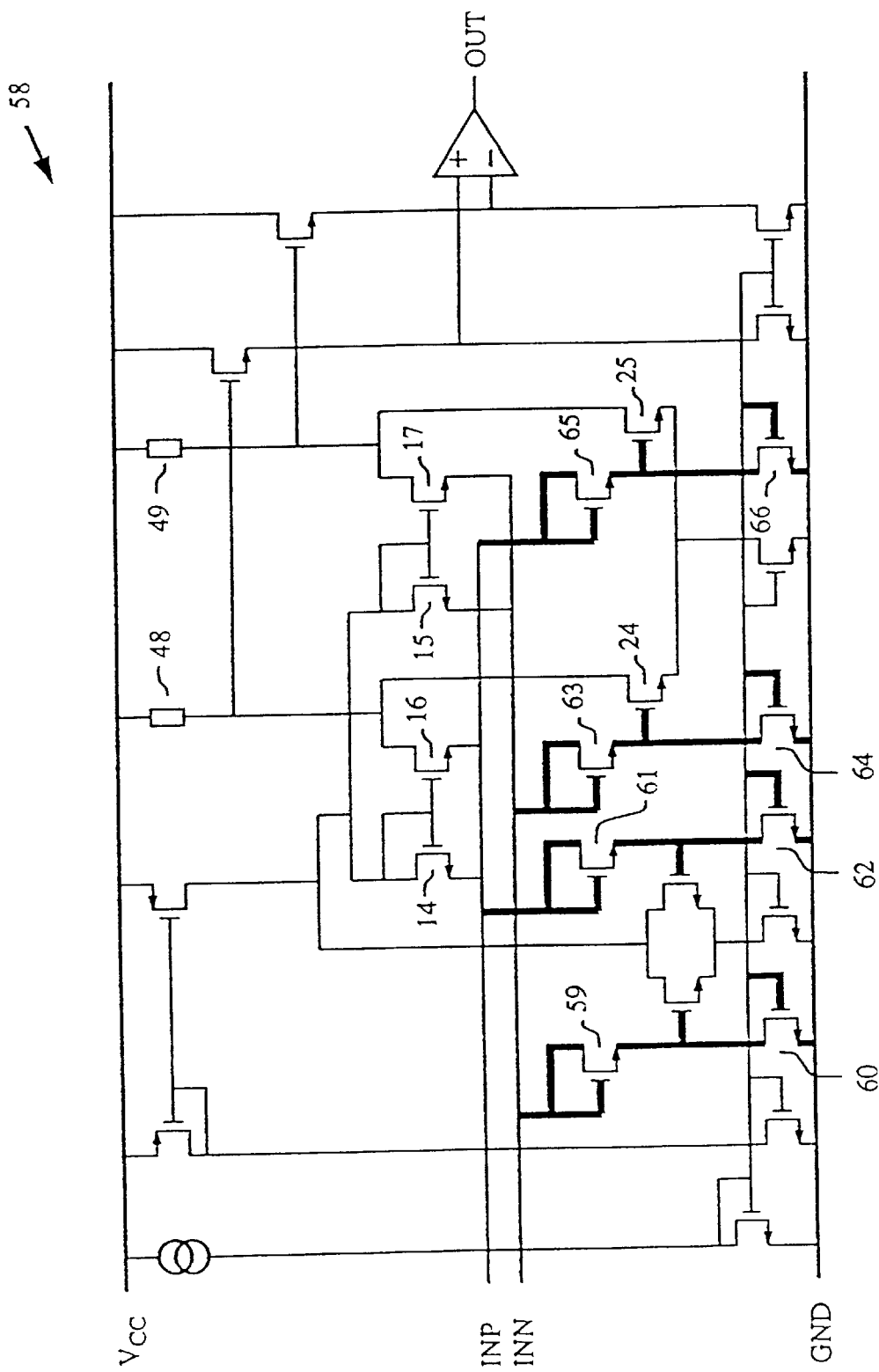
FIG. 7 is a circuit diagram showing a fourth embodiment of the receiver device according to FIG. 1.

FIG. 7 shows a receiver device 58, which is a fourth embodiment of the receiver device 1 according to FIG. 1. The receiver device 58 resembles the receiver device 28, shown in FIG. 5, however transistors 59–66 and connections, which connections are highlighted (drawn with thick lines), have been added according to the drawing. Shown voltage-generator and current-generator arrangements of the transistors 59–66 serve the purpose of turning voltages applied at the inputs INP, INN into lower voltages within a second input circuit, said second input circuit corresponding to the aforementioned input circuit 3 of FIG. 1. The receiver device 58 is thereby capable of receiving signals at its inputs INP, INN at a common-mode voltage much higher than the supply voltage $V_{CC}$. The common-mode voltage range is hence further improved compared with the previously described embodiments. At a supply voltage of 3.3 V, the receiver device 7 is compatible with DPECL, and operates at common-mode voltages higher than 4.5 V, and lower than –0.5 V.

A propagation delay added by the transistors 63–66 is compensated for by sinking a larger current through the resistive elements 48, 49 in the second mode of operation than in the first mode of operation.

Figure 8:
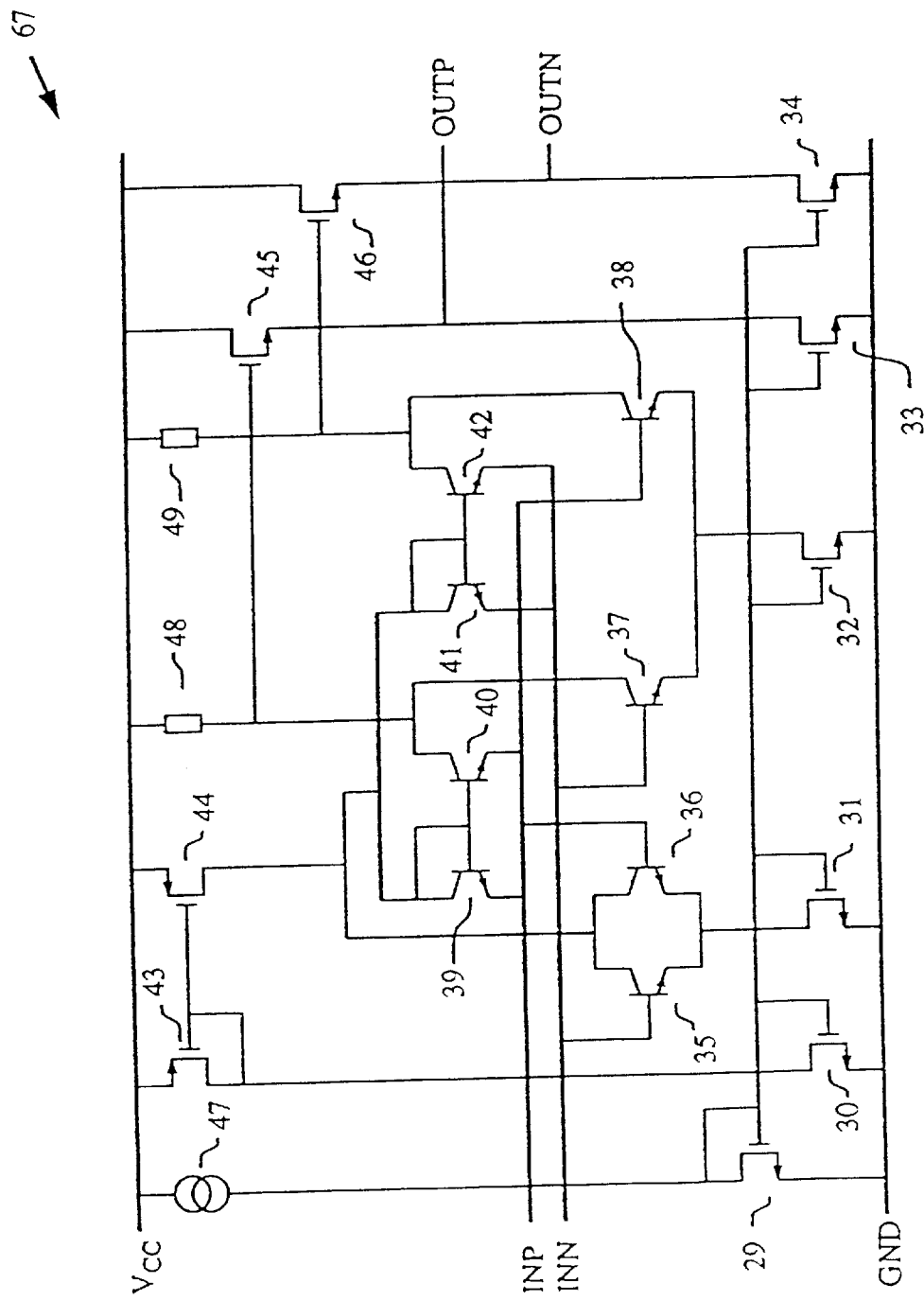
FIG. 8 is a circuit diagram showing a fifth embodiment of the receiver device according to FIG. 1.

FIG. 8 shows a receiver device 67, which is a final embodiment of the receiver device 1 according to FIG. 1. Bipolar transistors are connected and used as indicated in the drawing. NPN transistors are used rather than PNP transistors because NPN-transistors exhibit superior bandwidth and gain and less propagation delay compared with PNP transistors in certain circuit technologies.

In this description, the terms "speed" and "bandwidth" refer to an ability to handle high information transfer rates, i.e. high frequency signalling. These terms can be regarded herein as equivalents.

According to exemplary embodiments, the term "first transistors" refers to the transistors 14 and 15 or corresponding elements 39, 41 or the like in other embodiments of the invention. The term "second transistors" refers to the transistors 24 and 25 or corresponding elements 37, 38 or the like in other embodiments of the invention. The term "load circuit-elements" refers to the transistors 18 and 20, or to the resistors 48 and 49.

It is obvious for those skilled in the art that the shown embodiments can be almost freely combined into new embodiments without departing from the scope and the spirit of the invention.

Furthermore, the invention is not restricted to handling of information in digital form, but may as well be used for analog signals.

For simplicity, the invention has been described using two input circuits in the input stage 4. The principles of the invention however also apply to a receiver device comprising three or more input circuits.

What is claimed is:

1. A receiver device comprising an input stage for receiving a differential signal at its inputs, a driver stage and an output stage, said input stage in turn comprising a first input circuit, and a second input circuit connected in parallel, said first input circuit comprising first transistors for directly receiving signals from outside said receiver device, said second input circuit comprising second transistors for directly receiving signals from outside said receiver device, wherein said first transistors and said second transistors are of one and the same type, and one of said first transistors is comprised in a first current mirror, and another one of said first transistors is comprised in a second current mirror, whereby said receiver device is capable of high speed operation over a wide common-mode range.

2. A receiver device according to claim 1, wherein said first current mirror and said second current mirror comprise cascode-connected transistors for achieving low error in a chain of current mirrors in the receiver device, whereby error multiplication is reduced.

3. A receiver device according to claim 1, wherein said second input circuit comprises transistors connected for shunting a current so as to maintain a constant aggregate current through load circuit-elements for common-mode voltages at the inputs within an entire common-mode range, whereby propagation delay through said receiver device is substantially independent of said common-mode voltages.

* * * * *